United States Patent
Leung et al.

(10) Patent No.: US 7,955,968 B2
(45) Date of Patent: Jun. 7, 2011

(54) PSEUDO HYBRID STRUCTURE FOR LOW K INTERCONNECT INTEGRATION

(75) Inventors: Pak K. Leung, Cedar Park, TX (US); Terry G. Sparks, Niskayuna, NY (US); David V. Horak, Essex Junction, VT (US); Stephen M. Gates, Ossining, NY (US)

(73) Assignee: Freescale Semiconductor, Inc., Austin, TX (US)

( * ) Notice: Subject to any disclaimer, the term of this patent is extended or adjusted under 35 U.S.C. 154(b) by 110 days.

(21) Appl. No.: 12/399,372

(22) Filed: Mar. 6, 2009

(65) Prior Publication Data

US 2010/0227471 A1    Sep. 9, 2010

(51) Int. Cl.
*H01L 21/4763* (2006.01)
(52) U.S. Cl. ............ 438/622; 438/624; 257/E21.498; 257/E21.579
(58) Field of Classification Search .......... 438/622, 438/624, 638, 637; 257/E21.498, E21.579
See application file for complete search history.

(56) References Cited

U.S. PATENT DOCUMENTS

| | | | |
|---|---|---|---|
| 6,774,053 B1 * | 8/2004 | Ryan et al. ............... 438/780 |
| 7,183,195 B2 | 2/2007 | Lee et al. | |
| 7,199,474 B2 | 4/2007 | Buchanan et al. | |
| 2004/0175922 A1 | 9/2004 | Solomentsev et al. | |
| 2006/0094234 A1 * | 5/2006 | Soda et al. ............... 438/638 |
| 2007/0161226 A1 * | 7/2007 | Dalton et al. ............ 438/622 |
| 2007/0224824 A1 * | 9/2007 | Chen et al. .............. 438/700 |
| 2008/0145795 A1 * | 6/2008 | Yudhistira et al. ....... 430/313 |
| 2008/0182379 A1 | 7/2008 | Smith et al. | |

OTHER PUBLICATIONS

G. Lopez et al., The Impact of Size Effects and Copper Interconnect Process Variations on the Maximum Critical Path Delay of Single and Mutli-Core Microprocessors, International Interconnect Technology Conference, IEEE, Jun. 4-6, 2007.

* cited by examiner

*Primary Examiner* — Walter L Lindsay, Jr.
(74) *Attorney, Agent, or Firm* — Hamilton & Terrile, LLP; Michael Rocco Cannatti

(57) ABSTRACT

A method and apparatus are described for fabricating an ultra low-k interconnect structure by depositing and curing a first via layer (43) of ultra low dielectric constant (ULK) material, depositing a second uncured trench layer (51) of the same ULK material, selectively etching a via opening (62) and trench opening (72) with a dual damascene etch process which uses a trench etch end point signal from the chemical differences between uncured trench layer (51) and the underlying cured via layer (43), and then curing the second trench layer (83) before forming an interconnect structure (91) by filling the trench opening (72) and via opening (62) with an interconnection material so that there is no additional interface or higher dielectric constant material left behind.

21 Claims, 4 Drawing Sheets

PSEUDO HYBRID STRUCTURE FOR LOW K INTERCONNECT INTEGRATION

BACKGROUND OF THE INVENTION

1. Field of the Invention

The present invention is directed in general to the field of semiconductor devices. In one aspect, the present invention relates to the fabrication of low-k interlayer dielectric layers on a substrate.

2. Description of the Related Art

Semiconductor devices typically include device components (such as transistors and capacitors) that are formed on or in a substrate as part of the front end of line (FEOL) processing. In addition, interconnect features (such as contacts, metal lines and vias) that connect the device components to the outside world are included as part of the back end of line (BEOL) integration process whereby one or more dielectric layers are formed in and between the interconnect features for purposes of electrically isolating the interconnect features and device components. But as geometries in microelectronic devices continue to shrink in size, the RC delay and crosstalk effects caused by the more densely packed interconnect features have increased. In response, low dielectric constant (low-k) dielectric layers (e.g., materials having a relative permittivity or dielectric constant that is typically less than four) are increasingly used to isolate the interconnect and metallization features from the underlying device components in order to minimize RC delay and crosstalk. In addition, multi-layered interconnection structures are increasingly used to improve device reliability, where each interconnection layer is formed in a planar fashion.

In this area, dual damascene processes have been developed for fabricating low-k interlayer dielectric structures, such as described at U.S. Pat. No. 7,183,195 and U.S. Pat. No. 7,199,474. However, in these conventional dual damascene fabrication processes, the depth of the trench opening is controlled by etch time when the etch rate is assumed to be stable, but the actual etch rate can be sensitive to many factors, such as chamber condition and the property of the material being etched. For example, FIG. 1 depicts a partial cross-sectional view of a conventional hybrid dielectric structure formed with two different dielectric layers 12, 13 that are disposed over a substrate 1, where the first or via level layer 12 is formed with a higher dielectric constant material having a lower etch rate, and the second or trench level layer 13 is formed with lower dielectric constant material having a higher etch rate. The etch selectivity between the different materials in the layers 12, 13 provides the endpoint signal and trench depth control when forming the trench opening 14. However, a drawback of this scheme is the higher total capacitance and the introduction of an additional interface between the first and second dielectric layers 12, 13 which could become a reliability concern. Another example of a conventional hybrid dielectric structure is shown in FIG. 2 which depicts a partial cross-sectional view of a hybrid dielectric structure in which an intervening etch stop layer 16 is formed between two different dielectric layers 15, 17 formed over a substrate 1. Typically, the etch stop layer 16 is formed with a higher dielectric constant material having a lower etch rate, which can improve the trench etch control and the total capacitance as compared to the hybrid dielectric structure of FIG. 1, but at the expense of adding additional interfaces which can further worsen reliability problems.

Accordingly, a need exists for an improved interlayer dielectric structures and processes for fabricating same with improved process control, less variation in trench depth variation, reduced yield loss, and/or improved device performance to overcome the problems in the art, such as outlined above. Further limitations and disadvantages of conventional processes and technologies will become apparent to one of skill in the art after reviewing the remainder of the present application with reference to the drawings and detailed description which follow.

BRIEF DESCRIPTION OF THE DRAWINGS

The present invention may be understood, and its numerous objects, features and advantages obtained, when the following detailed description is considered in conjunction with the following drawings, in which.

Figure 1:
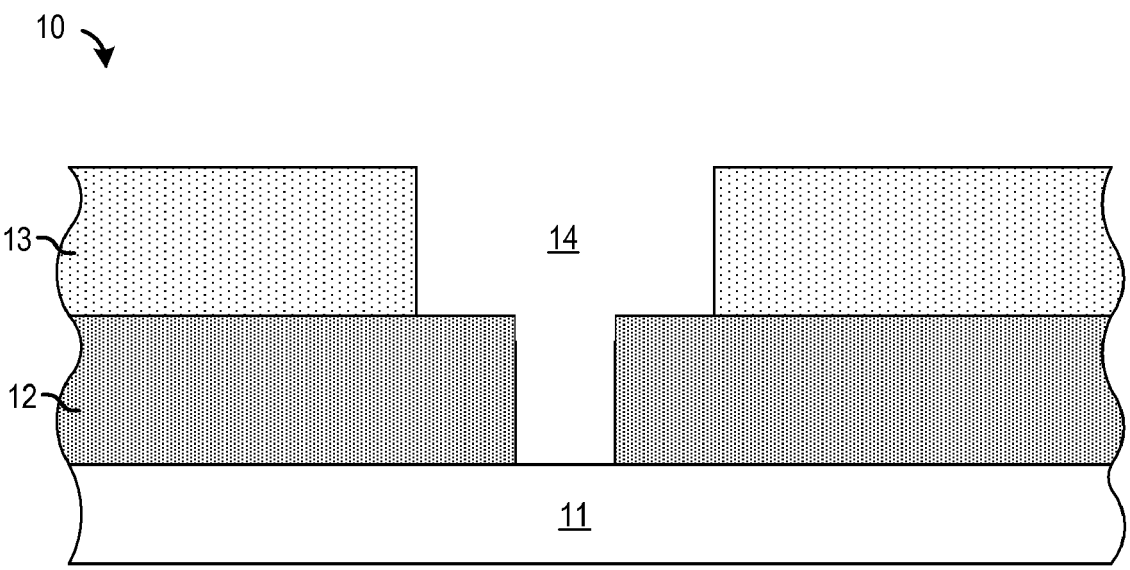
FIG. 1 is a partial cross-sectional view of a semiconductor device illustrating a conventional hybrid dielectric structure formed with two different dielectric layers that are disposed over a substrate.
Figure 2:
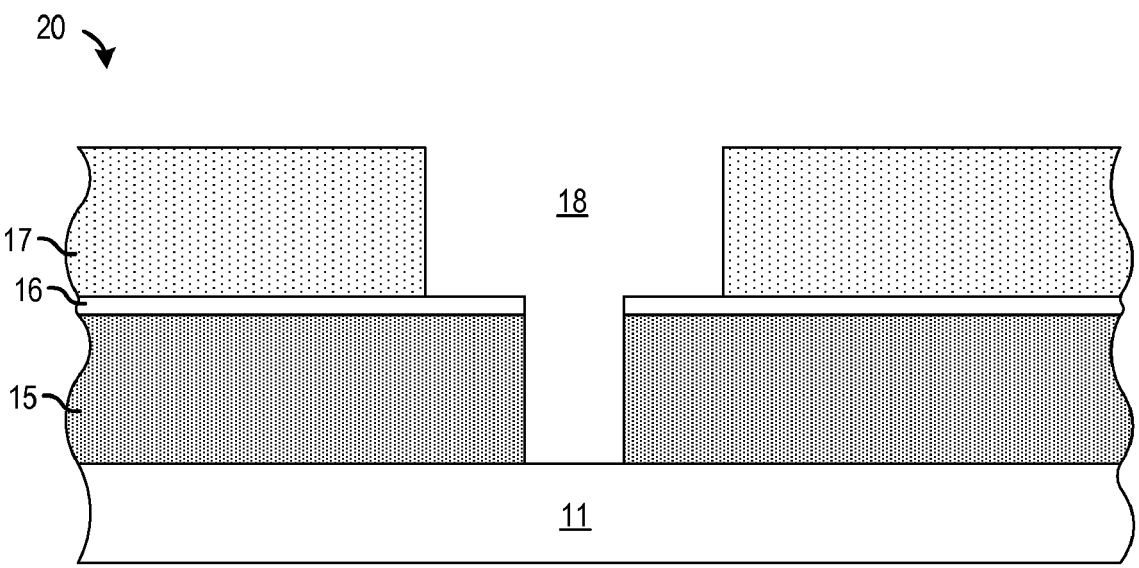
FIG. 2 is a partial cross-sectional view of a semiconductor device illustrating another conventional hybrid dielectric structure in which two different dielectric layers with an intervening etch stop layer are formed over a substrate.

It will be appreciated that for simplicity and clarity of illustration, elements illustrated in the drawings have not necessarily been drawn to scale. For example, the dimensions of some of the elements are exaggerated relative to other elements for purposes of promoting and improving clarity and understanding. Further, where considered appropriate, reference numerals have been repeated among the drawings to represent corresponding or analogous elements.

DETAILED DESCRIPTION

A method and apparatus are described for fabricating an ultra low-k interconnect structure on a semiconductor device where a first layer of ultra low dielectric constant (ULK) material is deposited to a predetermined thickness and then cured to form a via level dielectric layer. On the via layer, a second layer of ULK material is deposited to a predetermined thickness to form a trench level dielectric layer, but the trench layer is not cured at this stage of the fabrication. With the cured via layer and uncured trench layers in place, a dual damascene structure is formed by selectively patterning and anisotropically etching a via opening through the via and trench layers, followed by selectively patterning and anisotropically etching a trench opening through the trench layer, such that the trench opening overlaps with the via opening.

Alternatively, the trench opening can be formed before the via opening. By etching the trench opening through the uncured trench layer, a trench etch end point signal will come from the chemical differences between uncured trench layer and the underlying cured via layer. Depth control is further enhanced by the etch selectivity between these two different phases of the same material. After etching the via and trench openings, a second cure process is applied to cure the trench layer, thereby eliminating the interface between the via and trench layers so that there is no additional distinct interface or appreciably higher dielectric constant material left behind when the cure conditions are optimized.

Various illustrative embodiments of the present invention will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, it is noted that, throughout this detailed description, certain layers of materials will be deposited and removed to form the depicted semiconductor structures. Where the specific procedures for depositing or removing such layers are not detailed below, conventional techniques to one skilled in the art for depositing, removing or otherwise forming such layers at appropriate thicknesses shall be intended. Such details are well known and not considered necessary to teach one skilled in the art of how to make or use the present invention. In addition, selected aspects are depicted with reference to simplified cross sectional drawings of a semiconductor device without including every device feature or geometry in order to avoid limiting or obscuring the present invention. Such descriptions and representations are used by those skilled in the art to describe and convey the substance of their work to others skilled in the art. It is also noted that, throughout this detailed description, certain elements in the figures are illustrated for simplicity and clarity and have not necessarily been drawn to scale. For example, the dimensions of some of the elements in the figures may be exaggerated relative to other elements to help improve the understanding of the embodiments of the present invention.

Figure 3:
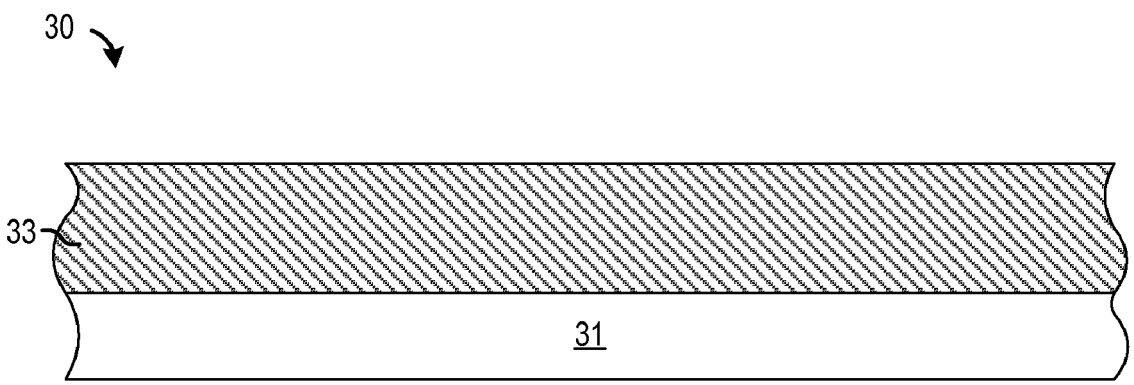
FIG. 3 is a partial cross-sectional view of a semiconductor device in which a first ultra low-k (ULK) dielectric layer is disposed over a substrate.

Turning now to FIG. 3, there is depicted a partial cross-sectional view of a semiconductor device 30 in which a first ultra low-k (ULK) dielectric layer 33 is disposed over a substrate 31. Depending on the type of integrated circuit devices being fabricated, the substrate 31 may be implemented as a bulk silicon substrate, single crystalline silicon (doped or undoped), or any semiconductor material including, for example, Si, SiC, SiGe, SiGeC, Ge, GaAs, InAs, InP as well as other Group III-IV compound semiconductors or any combination thereof, and may optionally be formed as the bulk handling wafer. In addition, the substrate 31 may be implemented as the top semiconductor layer of a semiconductor-on-insulator (SOI) structure or a hybrid substrate comprised of bulk and/or SOI regions having any desired crystal orientation relative to the underlying substrate.

Though not explicitly shown, one or more active or passive integrated circuit devices are formed on a substrate 31, including but not limited to MOS or non-volatile memory transistor or capacitor device components. In addition, the substrate 31 may include any number of layers, e.g., such as interconnect wiring layers or contacts to active and passive components. For example, the substrate 31 may include a passivation layer formed over the active or passive integrated circuit devices to a predetermined thickness (e.g., a layer of SiN, SiCN, SiC, etc. that is at least approximately 100 Angstroms to 2,000 Angstroms thick).

Regardless of the specific type of integrated circuit devices formed, the substrate 31 is electrically isolated with a BEOL process that begins by blanket depositing a first layer of low-k (dielectric constant k less than 4.0) or ultra low-k (ULK) (dielectric constant k less than or equal to 2.5) dielectric material 33 by chemical vapor deposition (CVD), plasma-enhanced chemical vapor deposition (PECVD), physical vapor deposition (PVD), atomic layer deposition (ALD), spin coating, or any combination thereof to any predetermined thickness, e.g., in a range of 1,000 to 5,000 Angstroms. (For purposes of the present description, the expression "low-k dielectric" is intended to cover both low-k and ultra-low-k dielectrics, unless the context indicates otherwise, though it will be appreciated that selected embodiments of the present invention may advantageously be implemented with ultra low-k dielectric interconnect layers). The first low-k dielectric layer 33 may be formed from any curable dielectric material having suitable dielectric properties (e.g., materials having a relative permittivity or dielectric constant that is typically less than or equal to 2.5). Another property of the first low-k dielectric layer 33 is that it has different chemical composition, depending on whether it is cured or not. Such chemical differences may be exploited to give endpoint signal for enhanced etch depth control. For example, the first low-k dielectric layer 33 may have a first relatively high etch rate when the layer 33 is not cured, and a second relatively lower etch rate when the layer 33 is cured. In selected embodiments, the first low-k dielectric layer 33 may be formed as a porous ultra-low k layer from one or more constituent layers of an inorganic matrix of polymethylsilsesquioxane (p-MSQ) containing a pore-generating material (porogen), such as acrylate. In other embodiments, a layer of low-k dielectric material (such as PECVD porous dielectric from a silicon base precursor and porogen, or another organic or inorganic low-k dielectric material) is deposited over the substrate 31.

After the low-k dielectric layer 33 has been formed over the substrate 31, the layer 33 may be polished, if necessary, into a planarized dielectric layer, as illustrated in FIG. 3. For example, a chemical mechanical polishing step may be used to polish the deposited low-k dielectric layer 33 though other etch processes may be used to planarize the dielectric layer 33.

Figure 4:
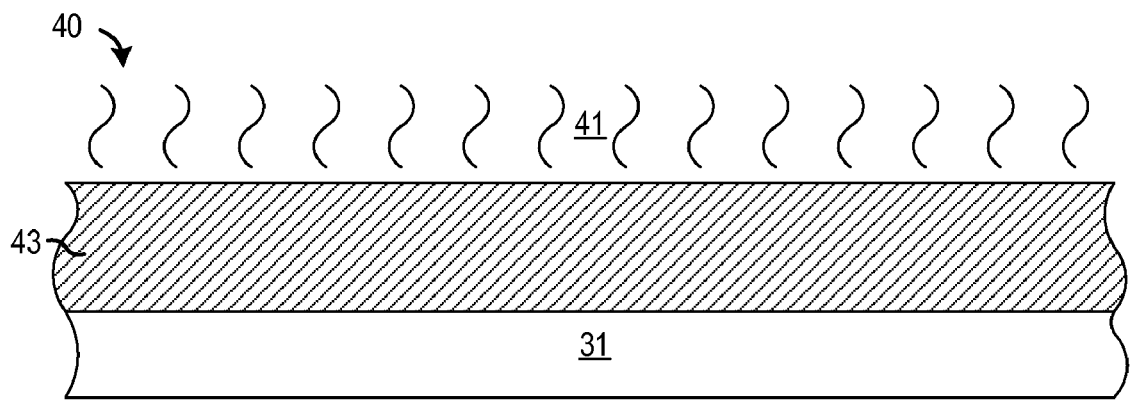
FIG. 4 illustrates processing subsequent to FIG. 3 after the ULK dielectric layer is cured.

FIG. 4 illustrates processing of a semiconductor device 40 subsequent to FIG. 3 after a cure process 41 is applied to the first low-k dielectric layer 33, thereby forming a cured dielectric layer 43 having a suitably low dielectric constant. The cure process 41 acts to expel the porogen from the layer 33, leaving a nanoporous layer 43 having a low dielectric constant, though a variety of materials and cure processes can be used to produce mesoporous or nanoporous low-k dielectric layers 43. Examples of cure processes 41 include, but are not limited to, an in-situ plasma cure process of applying heat to the semiconductor device 40 in a thermal anneal step, applying ultraviolet radiation (UV), applying a UV-assisted thermal cure (e.g., ultraviolet radiation and heat), applying an electron beam (Ebeam) curing process, and/or the like. As will be appreciated, the curing process 41 may be selected based on the tradeoffs between the processing results and performance impact. For example, a thermal anneal process can cause undesirable effects on other components of integrated circuit devices being formed on the semiconductor device 40 (e.g. on Cu metal lines already present on the wafer), in which case a UV curing step can be used which involves heating the semiconductor device 40, but for a much shorter time than would be necessary for a thermal annealing process alone (e.g. 1/20 of the time needed for thermal annealing). In selected embodiments, the curing process 41 employs a UV radiation being applied to the first dielectric layer 43 while the semiconductor device 40 is heated, typically by heating the chuck supporting the wafer (as in conventional methods for expelling porogens). As an example, the semiconductor device 40 may be held at a temperature of the order of 400 degrees Celsius for a period of the order of 10 minutes under a dedicated UV light source designed to meet the curing characteristics of an ultra low-k material. By virtue of the cure process 41, the resulting cured low-k layer 43 has suitable dielectric properties (e.g., materials having a relative permittivity or dielectric constant that is typically less than or equal to 2.5) and has a different chemical composition from the uncured first low-k layer 33.

Figure 5:
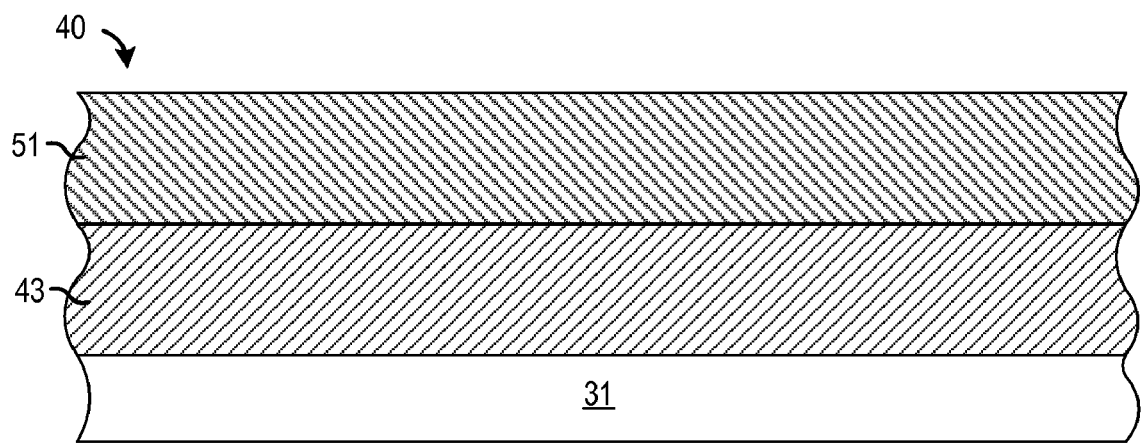
FIG. 5 illustrates processing subsequent to FIG. 4 after a second ULK dielectric layer is disposed over the cured first ULK dielectric layer.

FIG. 5 illustrates processing of a semiconductor device 50 subsequent to FIG. 4 after a second low-k dielectric layer 51 is disposed over the cured first low-k dielectric layer 43. The second low-k dielectric layer 51 may be formed from any known dielectric material having suitable dielectric and etch rate properties, though in selected embodiments, the second low-k dielectric layer 51 is formed from the same material as used to initially form the first low-k dielectric layer 33, such as by depositing a second layer of low-k or ultra low-k dielectric material 51 by CVD, PECVD, PVD, ALD, spin coating, or any combination thereof to any predetermined thickness, e.g., in a range of 1,000 to 5,000 Angstroms. Thus, the second low-k dielectric layer 51 may be formed from a curable dielectric material (e.g., an inorganic matrix of p-MSQ containing porogen) having a relative permittivity or dielectric constant that is typically less than or equal to 2.5. The chemical composition differences between the cured and uncured dielectric layers may be exploited to give an endpoint signal for etch depth control. In FIG. 5, the difference in the physical properties between the cured first layer 43 and the uncured second layer 51 is visually indicated by the different cross-hatching on the two layers 43, 51.

Figure 6:
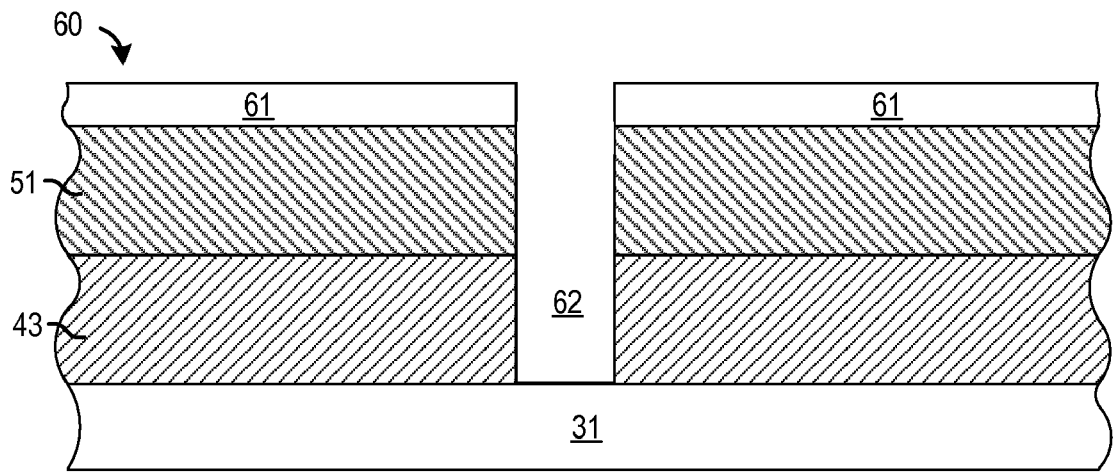
FIG. 6 illustrates processing subsequent to FIG. 5 after a via opening is formed in the ULK dielectric layers.

FIG. 6 illustrates processing of a semiconductor device 60 subsequent to FIG. 5 after a via opening 62 is formed in the low-k dielectric layers 43, 51. As illustrated, each via opening 62 is etched through the low-k layer stack 43, 51 to expose a region of the substrate 31, such as an underlying metal contact region, interconnect region, source/drain region or a gate electrode in the substrate 31. For current state-of-the-art circuit designs, the via opening 62 has a width of approximately 50 to 100 nanometers. Any desired photolithography and/or selective etch techniques can be used to form the via opening 62. For example, the via opening 62 may be formed by depositing and patterning one or more protective etch mask and/or photoresist layers 61 over the uncured second low-k layer 51, and then anisotropically etching (e.g., reactive ion etching) the exposed low-k layer stack 43, 51 to form the via opening 62. In an example embodiment, a two-stage etch process is used which removes selected portions of the low-k layer stack 43, 51 before reaching the substrate 31. As a first step, one or more protective etch mask and/or photoresist layers 61 may be applied and patterned directly on the second uncured low-k dielectric layer 51, though multi-layer masking techniques may also be used to define the locations of the via opening(s) 62. In the second step, the exposed portions of the second uncured low-k dielectric layer 51 and the underlying first cured low-k dielectric layer 43 are removed by using the appropriate etchant processes to etch the via opening(s) 62, such as an anisotropic reactive ion etching (RIE) process using $O_2$, $N_2$, or a fluorine-containing gas. By forming the low-k layer stack 43, 51 with the same material, a single etch process (such as an Argon, $CHF_3$, or $CF_4$ chemistry that is used to etch carbon-doped oxide film) may be used to selectively remove the exposed dielectric materials in the low-k layer stack 43, 51. However, there is no need to use a trench etch endpoint detection process, since the etch process will terminate at the underlying substrate 31.

Figure 7:
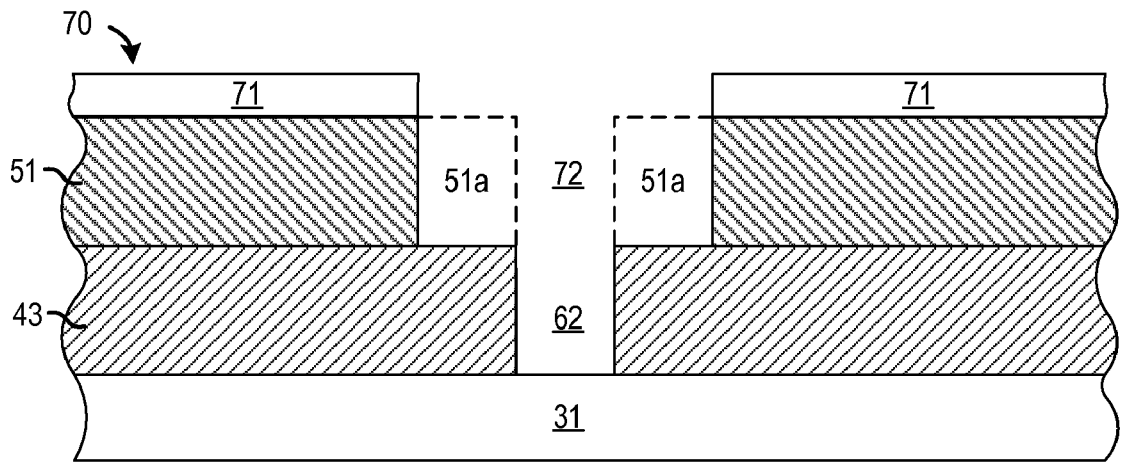
FIG. 7 illustrates processing subsequent to FIG. 6 after a trench opening is formed in the second ULK dielectric layer.

FIG. 7 illustrates processing of a semiconductor device 70 subsequent to FIG. 6 after one or more trench openings 72 are formed in the second low-k dielectric layer 51. In particular, after removing the patterned etch mask/photoresist layer(s) 61, one or more second patterned etch mask/photoresist layer(s) 71 are formed to define an opening which exposes portions 51a of the uncured second low-k layer 51 (indicated in dashed lines). Though not explicitly shown, it will be appreciated that the formation of the patterned etch mask/photoresist layer(s) 71 may leave remnant material in the bottom or sides of the via opening(s) 62 which is subsequently removed. Through the opening(s) in the second patterned etch mask/photoresist layer(s) 71, a directional etch process may be applied to remove the exposed portions 51a to form the trench opening(s) 72 in the second uncured low-k dielectric layer 51. For current state-of-the-art circuit designs, the trench opening 72 has a width of approximately 50 to 100 nanometers. And while any desired photolithography and/or selective etch techniques can be used to form the trench opening(s) 72, in selected example embodiments, the trench opening 72 is formed by depositing and patterning one or more protective etch mask and/or photoresist layers 71 over the uncured second low-k layer 51, and then anisotropically etching (e.g., reactive ion etching) the exposed second uncured low-k dielectric layer 51 down to the underlying cured first low-k dielectric layer 43. Since the underlying first low-k dielectric layer 43 has previously been cured, it has a different chemical composition than the uncured second low-k layer 51, and this difference can therefore be used to generate a trench etch end point signal using techniques such as emission spectroscopy between the cured layer 43 and the uncured layer 51. When the etch endpoint signal has been detected to indicate that the etch process has reached the underlying cured first low-k dielectric layer 43, a signal is sent to the etch tool to discontinue the etch process.

Figure 8:
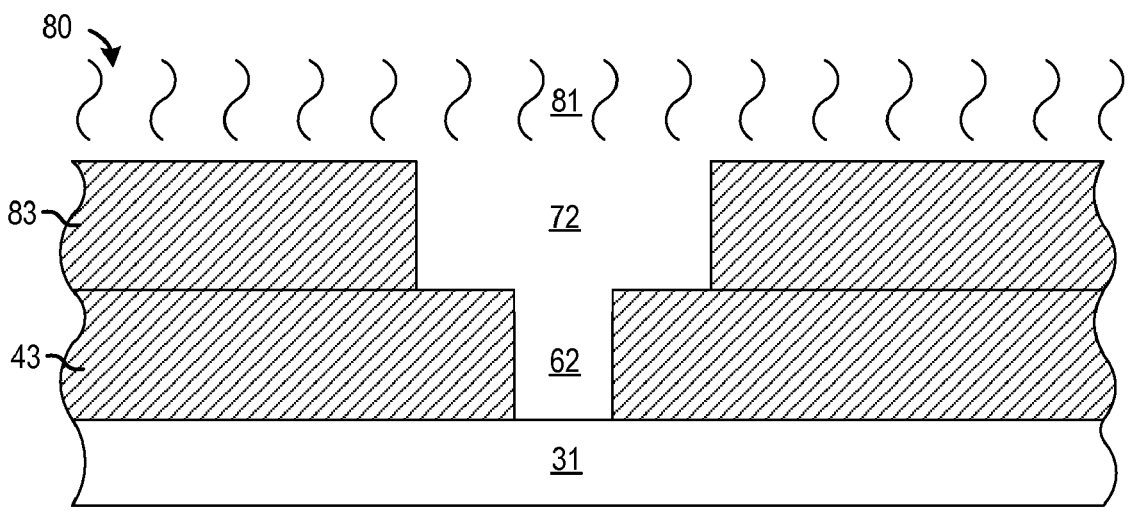
FIG. 8 illustrates processing subsequent to FIG. 7 after the second ULK dielectric layer is cured.

FIG. 8 illustrates processing of a semiconductor device 80 subsequent to FIG. 7 after a cure process 81 is applied to the second low-k dielectric layer 51, thereby forming a cured dielectric layer 83 having the same physical properties (e.g., dielectric constant) as the underlying first low-k dielectric layer 43. In this way, there is no interface between the two dielectric layers 43, 83 so that the two indistinguishable layers form a homogenous dielectric stack 43, 83. Where the second low-k dielectric layer 51 has been formed with a porogen, any desired cure process 81 (e.g., thermal annealing, in-situ plasma curing, UV curing, UV-assisted thermal curing, Ebeam curing, etc.) may be used to expel the porogen from the layer 51, leaving a nanoporous layer 83 having a low dielectric constant, though a variety of materials and cure processes can be used to produce mesoporous or nanoporous low-k dielectric layers 83. By virtue of the cure process 81, the resulting cured low-k layer 83 has suitable dielectric properties (e.g., materials having a relative permittivity or dielectric constant that is typically less than or equal to 2.5). In FIG. 8, the similarity or substantial identity in the physical properties between the cured first layer 43 and the cured second layer 83 is visually indicated by the same cross-hatching on the two layers 43, 83.

As will be appreciated, additional processing steps may be used to complete the fabrication of the semiconductor device 80 into a functioning device. In addition to various front end processing steps (such as sacrificial oxide formation, stripping, isolation region formation, gate electrode formation, extension implant, halo implant, spacer formation, source/drain implant, annealing, silicide formation, and polishing steps), additional backend processing steps may be performed, such as forming multiple levels of interconnect(s) that are used to connect the device components in a desired manner to achieve the desired functionality. Thus, the specific sequence of steps used to complete the fabrication of the device components may vary, depending on the process and/or design requirements.

Figure 9:
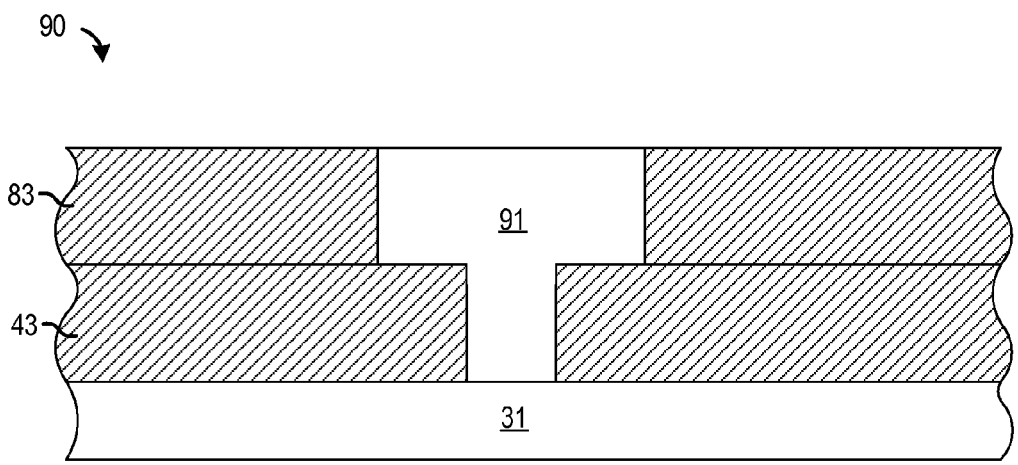
FIG. 9 illustrates processing subsequent to FIG. 8 after a conductive layer is formed on the dual damascene interconnection region and then planarized to form a dual damascene interconnection.

Referring to FIG. 9, there is illustrated processing of a semiconductor device 90 subsequent to FIG. 8 after a conductive layer 91 is formed on the dual damascene interconnection region 62, 72 and then planarized to form a dual damascene interconnection 91. The conductive layer 91 may be formed of aluminum, tungsten, copper, or any alloy thereof, and most preferably formed of copper because of its low resistance. Also, the conductive layer 91 may be a stack of a diffusion barrier layer and a main interconnection layer, or may be embodied in various other forms by known methods.

Figure 10:
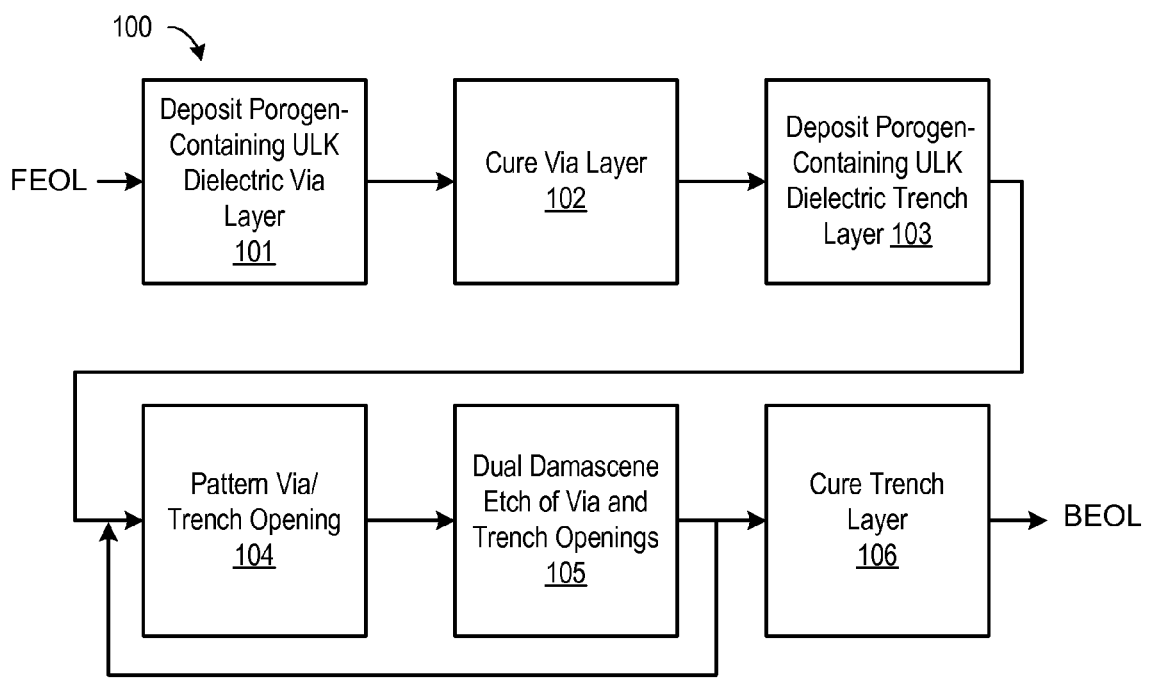
FIG. 10 is a flow diagram illustrating a process for forming an ultra low-k interconnect structure.

FIG. 10 is a flow diagram illustrating an example process 100 for forming an ultra low-k interconnect structure. As shown, the process picks up after the front end of line (FEOL) process and begins by forming a first via layer (step 101), such as by depositing a porogen-containing ultra low-k dielectric layer. Next, the via layer is cured at step 102, such as by using an ultraviolet or electron beam curing process. At this point, the first via layer has a suitably low dielectric constant value. Subsequently, a second trench layer is deposited (step 103), such as by depositing a layer of the same porogen-containing ultra low-k dielectric material as was used to form the via layer. In selected cluster tool embodiments, the steps 101, 102, and 103 are performed in a single cluster tool under software control without air exposure. This is done to reduce contamination of the interface between dielectric layers 43 and 51, and will result in adhesion improvement between these 2 dielectric layers. However, the trench layer is not cured at this point, but is instead patterned (step 104) and etched (step 105) to form the via openings through the via and trench layers. As indicated by the feedback line between step 105 and step 104, the pattern and etch process is repeated to form the trench openings in the trench layer by using a trench etch end point signal from the chemical differences between the cured via layer and the uncured trench layer to control the depth of the trench opening(s). This end point signal is more repeatable and not affected by contamination of the dielectric interface in the cluster tool embodiment. Some kinds of contamination can make the end point signal more difficult to detect. Once the via and trench openings are formed, the trench layer is cured at step 106, after which standard BEOL processing may be used to complete the device. By curing the trench layer after forming the trench opening(s), the interface between the via and trench layers is eliminated, and a homogenous dielectric stack is provided where the trench and via layers are indistinguishable from one another. It will be appreciated that the etch sequence described hereinabove is known in the industry as "Via First Trench Last" integration. However, other embodiments of the present invention can use other variations of dual damascene integration schemes to provide similar benefits. Examples include, but are not limited to "Trench First Via Last" integrations where the trench opening is formed first, and the lower via opening is formed later. In the "trench first" embodiment, a patterned etch mask/photoresist layer(s) is formed which exposes the uncured second low-k layer 51 to a first selective etch process which forms the trench opening 72, where the first selective etch process is stopped when a trench etch end point signal is generated based on the chemical differences between uncured trench layer 51 and the underlying cured via layer 43. After forming the trench opening, the via opening is etched by patterning a second etch mask (e.g., using another patterned etch mask/photoresist layer(s) or sidewall etch masks formed on the vertical sidewalls of the trench opening) that exposes the cured first low-k layer 43 to a second selective etch process which forms the narrower via opening.

By now it should be appreciated that there has been provided a method for fabricating dual damascene interconnections on a substrate structure. In the disclosed methodology, a first dielectric layer is formed over a substrate structure from a low-k dielectric material (e.g., having a dielectric constant of 2.5 or less) which has a first predetermined chemical composition or etch rate. The first dielectric layer may be formed by depositing a porogen-containing first dielectric material to a predetermined via layer thickness. At least part of the first dielectric layer is treated to modify its chemical composition, thereby forming a treated first dielectric layer, such as by applying ultraviolet radiation or an electron beam to the first dielectric layer. On the treated first dielectric layer, a second dielectric layer is formed from a low-k dielectric material (e.g., having a dielectric constant of 2.5 or less) which has the same chemical composition as the first layer before it is treated. The second dielectric layer may be formed by depositing a porogen-containing second dielectric material to a predetermined trench layer thickness, where the first and second dielectric layers are initially formed with the same dielectric material. In selected embodiments, the steps of forming the first dielectric layer, treating at least part of the first dielectric layer, and forming the second dielectric layer may be performed sequentially in a cluster tool which includes a deposition chamber and an ultraviolet cure chamber connected on a central cluster chamber. The first and second dielectric layers are then partially etched to form a via opening in the first and second dielectric layers, and then the second dielectric layer is partially etched to form a trench opening which is connected to the via opening and extends laterally beyond the via opening. The second dielectric layer may be partially etched by anisotropically etching the second dielectric layer using a trench etch end point signal from chemical differences between the second dielectric layer and the treated first dielectric layer to control formation of the trench opening. After etching the trench opening, at least part of the second dielectric layer may be treated so that the material forming the second dielectric layer has a dielectric constant that is substantially identical to the dielectric constant of the treated first dielectric layer. The treatment of the second dielectric layer may be implemented by applying ultraviolet radiation, UV-assisted thermal cure, or electron beam curing process to the second dielectric layer. Finally, an interconnect structure is formed by filling the trench opening and via opening with one or more conductive interconnection materials or layers.

In another form, there is provided a semiconductor device and a method for making same. In the disclosed methodology, a first cured low-k dielectric layer having a first dielectric constant value is formed over a semiconductor substrate. The first cured low-k dielectric layer may be formed by depositing a first uncured low-k dielectric layer over the semiconductor substrate to a predetermined via layer thickness with a material which includes porogen and has a dielectric constant of 2.5 or less, and then curing at least part of the first uncured low-k dielectric layer to form the first cured low-k dielectric layer, such as by applying ultraviolet radiation or an electron beam to the deposited porogen-containing low-k dielectric layer before forming the second uncured low-k dielectric layer. In other embodiments, the first cured low-k dielectric layer is formed by depositing a porous ultra-low k layer having one or more layers of an inorganic matrix of polymethylsilsesquioxane containing a pore-generating material or a PECVD porous dielectric layer formed from a silicon base precursor and porogen, and then curing the porous ultra-low k layer to form the first cured low-k dielectric layer. A second uncured low-k dielectric layer is subsequently formed directly on the first cured low-k dielectric layer, where the first cured low-k dielectric layer has a different chemical composition from the second uncured low-k dielectric layer. In selected embodiments, the second uncured low-k dielectric layer is formed by depositing a second low-k dielectric layer comprising porogen to a predetermined trench layer thickness, where the first and second low-k dielectric layers are initially formed with the same dielectric material. The second uncured low-k dielectric layer is then selectively etched to form a trench opening having a predetermined depth, where the different chemical composition of the first cured low-k dielectric layer is used to generate a trench etch end point signal to control the predetermined depth of the trench opening. In addition, the first cured low-k dielectric layer is selectively etched to form a via opening within the trench opening. In selected embodiments, the via opening is etched before etching the trench opening, and in other embodiments, the trench opening is etched before etching the via opening. After forming the trench and via openings, at least part of the second uncured low-k dielectric layer is cured to form a second cured low-k dielectric layer having a second dielectric constant value that is substantially equal to the first dielectric constant value. The second uncured low-k dielectric layer may be cured by applying an ultraviolet radiation, ultraviolet-assisted thermal cure, or electron beam curing process to the second uncured low-k dielectric layer. Finally, an interconnect structure is formed by filling at least part of the trench opening and via opening with a conductive layer comprising a conductive material, such as aluminum, tungsten or copper.

In yet another form, there is provided a method of fabricating one or more dual damascene interconnections. As disclosed, a first ultra low-k dielectric material is deposited to form a first ultra low-k dielectric layer over a substrate to a predetermined via layer thickness. The first ultra low-k dielectric layer is then cured to form a first cured ultra low-k dielectric layer. A second uncured ultra low-k dielectric layer is then formed directly on the first cured ultra low-k dielectric layer by depositing the first ultra low-k dielectric material to a predetermined trench layer thickness. A trench opening is then formed in the second uncured ultra low-k dielectric layer, such as by using a chemical difference between the first cured ultra low-k dielectric layer and the second uncured ultra low-k dielectric layer to generate a trench etch endpoint signal. After forming the trench opening, the second uncured ultra low-k dielectric layer is cured to form a second cured ultra low-k dielectric layer, thereby substantially eliminating any chemical difference between the first cured ultra low-k dielectric layer and the second cured ultra low-k dielectric layer. Thereafter, an interconnection is completed by filling at least the trench opening with an interconnection material, such as aluminum, tungsten or copper.

Although the described exemplary embodiments disclosed herein are directed to various semiconductor device structures and methods for making same, the present invention is not necessarily limited to the example embodiments which illustrate inventive aspects of the present invention that are applicable to a wide variety of semiconductor processes and/or devices. For example, selected embodiments of the present invention may be used to provide a dual damascene interconnect structure with homogenous dielectric layers at any point in the back end of line (BEOL) integration process. Thus, any reference to forming the dielectric layers over a substrate structure refers not only to forming the dielectric layers over the active devices formed in a semiconductor substrate structure, but also to forming the dielectric layers over or as part of a multilevel interconnect substrate structure. In addition, the described UV-curing process may use radiation of any appropriate wave-length that the ULK is designed for (e.g., broadband UV radiation) that is either selectively or non-selectively applied, and the applied radiation need not be monochromatic as broadband radiation could be applied. Thus, the particular embodiments disclosed above are illustrative only and should not be taken as limitations upon the present invention, as the invention may be modified and practiced in different but equivalent manners apparent to those skilled in the art having the benefit of the teachings herein. For example, the methodology of the present invention may be applied using materials other than expressly set forth herein. In addition, the invention is not limited to any particular type of integrated circuit described herein. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method of fabricating dual damascene interconnections on a substrate structure, comprising:

forming a first dielectric layer over a substrate structure, where the first dielectric layer is formed from a first material which has a dielectric constant of 2.5 or less and which has a predetermined chemical composition;

treating at least part of the first dielectric layer to modify the predetermined chemical composition, thereby forming a treated first dielectric layer;

forming a second dielectric layer directly on the treated first dielectric layer, where the second dielectric layer is formed from the first material;

partially etching the second dielectric layer and the treated first dielectric layer to form a via opening;

partially etching the second dielectric layer to form a trench opening which is connected to the via opening and extends laterally beyond the via opening;

treating at least part of the second dielectric layer so that the second dielectric layer has a dielectric constant that is substantially identical to the dielectric constant of the treated first dielectric layer; and forming an interconnect structure by filling the trench opening and via opening with an interconnection material.

2. The method of claim 1, where forming a first dielectric layer comprises depositing a first dielectric material comprising porogen to a predetermined via layer thickness.

3. The method of claim 1, where treating at least part of the first dielectric layer comprises applying ultraviolet radiation and heat to the first dielectric layer.

4. The method of claim 1, where treating at least part of the first dielectric layer comprises applying an electron beam to the first dielectric layer.

5. The method of claim 1, where forming a second dielectric layer comprises depositing a second dielectric material comprising porogen to a predetermined trench layer thickness, where the first and second dielectric layers are initially formed with the same dielectric material.

6. The method of claim 1, where partially etching the second dielectric layer comprises anisotropically etching the second dielectric layer using a trench etch end point signal from chemical differences between the second dielectric layer and the treated first dielectric layer to control formation of the trench opening.

7. The method of claim 1, where treating at least part of the second dielectric layer comprises applying ultraviolet radiation, an ultraviolet-assisted thermal cure, or electron beam curing process to the second dielectric layer.

8. The method of claim 1, where the steps of forming the first dielectric layer, treating at least part of the first dielectric layer, and forming the second dielectric layer are performed sequentially in a cluster tool comprising a deposition chamber and an ultraviolet cure chamber connected on a central cluster chamber.

9. A method of making a semiconductor device, comprising:
forming a first cured low-k dielectric layer over a semiconductor substrate having a first dielectric constant value;
forming a second uncured low-k dielectric layer directly on the first cured low-k dielectric layer, where the first cured low-k dielectric layer has a different chemical composition from the second uncured low-k dielectric layer;
selectively etching the second uncured low-k dielectric layer to form a trench opening having a predetermined depth, where the different chemical composition of the first cured low-k dielectric layer is used to generate a trench etch end point signal to control the predetermined depth of the trench opening;
selectively etching the first cured low-k dielectric layer to form a via opening;
curing at least part of the second uncured low-k dielectric layer after forming the trench opening and via opening to form a second cured low-k dielectric layer having a second dielectric constant value that is substantially equal to the first dielectric constant value.

10. The method of claim 9, where forming the first cured low-k dielectric layer comprises:
forming a first uncured low-k dielectric layer over the semiconductor substrate, where the first uncured low-k dielectric layer is formed from a material which has a dielectric constant of 2.5 or less; and
curing at least part of the first uncured low-k dielectric layer to form the first cured low-k dielectric layer.

11. The method of claim 9, where forming the first cured low-k dielectric layer comprises depositing a first low-k dielectric layer comprising porogen.

12. The method of claim 9, where forming the first cured low-k dielectric layer comprises applying ultraviolet radiation to a deposited porogen-containing low-k dielectric layer before forming the second uncured low-k dielectric layer.

13. The method of claim 9, where forming the first cured low-k dielectric layer comprises applying an electron beam to a deposited porogen-containing low-k dielectric layer before forming the second uncured low-k dielectric layer.

14. The method of claim 9, where forming the second uncured low-k dielectric layer comprises depositing a second low-k dielectric layer comprising porogen to a predetermined trench layer thickness, where the first and second low-k dielectric layers are initially formed with the same dielectric material.

15. The method of claim 9, where curing at least part of the second uncured low-k dielectric layer comprises applying an ultraviolet radiation, ultraviolet-assisted thermal cure, or electron beam curing process to the second uncured low-k dielectric layer.

16. The method of claim 9, where selectively etching the second uncured low-k dielectric layer to form the trench opening occurs before selectively etching the first cured low-k dielectric layer to form the via opening.

17. The method of claim 9, where selectively etching the second uncured low-k dielectric layer to form the trench opening occurs after selectively etching the first cured low-k dielectric layer to form the via opening.

18. The method of claim 9, where forming the first cured low-k dielectric layer comprises:
depositing a porous ultra-low k layer comprising one or more layers of an inorganic matrix of polymethylsilsesquioxane containing a pore-generating material or a PECVD porous dielectric layer formed from a silicon base precursor and porogen; and
curing the porous ultra-low k layer to form the first cured low-k dielectric layer.

19. The method of claim 9, further comprising forming an interconnect structure by filling at least part of the trench opening and via opening with a conductive layer comprising aluminum, tungsten or copper.

20. A method of fabricating dual damascene interconnections, comprising:
(a) depositing a first ultra low-k dielectric material to form a first dielectric layer over a substrate;
(b) curing the first dielectric layer to form a first cured dielectric layer;
(c) depositing the first dielectric material to form a second uncured dielectric layer directly on the first cured dielectric layer;
(d) forming a trench opening in the second uncured dielectric layer;
(e) curing the second uncured dielectric layer after forming the trench opening to form a second cured dielectric layer, thereby substantially eliminating any chemical difference between the first cured dielectric layer and the second cured dielectric layer; and
(f) completing interconnections by filling at least the trench opening with an interconnection material.

21. The method of claim 20, where forming a trench opening comprises forming a trench opening in the second uncured dielectric layer using a chemical difference between the first cured dielectric layer and the second uncured dielectric layer to generate a trench etch endpoint signal.

* * * * *